(12) United States Patent
Lin

(10) Patent No.: US 6,188,116 B1
(45) Date of Patent: *Feb. 13, 2001

(54) STRUCTURE OF A POLYSILICON PLUG

(75) Inventor: Kun-Chi Lin, Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/172,381

(22) Filed: Oct. 14, 1998

(30) Foreign Application Priority Data

Jul. 23, 1998 (TW) .................................. 87112023

(51) Int. Cl.⁷ ..................................... H01L 27/01
(52) U.S. Cl. .................. 257/413; 257/349; 257/377; 257/547; 257/620; 257/621; 257/754; 257/755; 257/757; 257/758; 257/774; 257/775
(58) Field of Search ..................... 257/413, 774, 257/754, 755, 621, 757, 758, 775, 349, 377, 547, 620

(56) References Cited

U.S. PATENT DOCUMENTS

| | | | |
|---|---|---|---|
| 4,675,715 | * | 6/1987 | Lepselter et al. ........................ 357/59 |
| 5,281,548 | * | 1/1994 | Prall ....................................... 437/43 |
| 5,641,991 | * | 6/1997 | Sakoh .................................... 257/755 |
| 5,796,135 | * | 8/1998 | Liang et al. .......................... 257/296 |

* cited by examiner

Primary Examiner—Mahshid Saadat
Assistant Examiner—Matthew E. Warren
(74) Attorney, Agent, or Firm—Thomas, Kayden, Horstemeyer & Risley

(57) ABSTRACT

A structure of a polysilicon via that includes a semiconductor substrate, a conducting layer on the substrate, a dielectric layer on the conducting layer, a polysilicon plug formed in the dielectric layer, a polysilicon layer on the polysilicon plug, and a silicide layer formed on the polysilicon layer. The polysilicon layer is electrically connected to the conducting layer through the polysilicon plug. The structure of a polysilicon via according to the invention prevents the occurrence of leakage currents in the presence of misalignment in the follow-up photolithography process.

9 Claims, 3 Drawing Sheets

STRUCTURE OF A POLYSILICON PLUG

CROSS-REFERENCE TO RELATED APPLICATION

This application claims the priority benefit of Taiwan application serial no. 87112023, filed Jul. 23, 1998, the full disclosure of which is incorporated herein by reference.

BACKGROUND OF THE INVENTION

1. Field of the Invention

This invention relates to a semiconductor device and, more particularly, to a structure of a polysilicon via of a dynamic random access memory (DRAM).

2. Description of Related Art

A polysilicon via is generally used in a capacitor-over-bit-line (COB) dynamic random access memory (DRAM) to connect a bit line and the source/drain regions on the substrate. Conventionally, a polysilicon via consists of a polysilicon layer and a silicide layer, wherein the polysilicon layer is used to control the resistance over the bit line, wherein the resistance of the bit line is proportional to the thickness of the polysilicon layer of the polysilicon via. Even though having a lower resistance over the bit line provides a better data transmission rate, the thickness of the polysilicon layer of the polysilicon via is usually made to provide a reasonable conductivity while also downsizing the device to fit within a limited space. However, a conventional polysilicon via lacks protection against the occurrence of misalignment in the follow-up photolithography process. That is, the conventional polysilicon via is easily etched through in the presence of misalignment. The conducting layer underneath the polysilicon layer could be damaged by the etching process, and that further causes the occurrence of leakage currents, which degrade the performance of a DRAM cell.

The fabricating process of a conventional polysilicon via is shown in FIGS. 1A through 1C.

Referring to FIG. 1A, a dielectric layer, of borophosphosilicate glass (BPSG), 30 is deposited on a polysilicon layer 20 by performing a chemical vapor deposition process, wherein the polysilicon layer 20 is formed on a provided substrate 10. By performing a photolithography process and an anisotropic etching process, a via hole 40 is formed to expose the polysilicon layer 20.

Referring next to FIG. 1B, sequentially, a polysilicon layer 50 and a tungsten silicide layer 60 are both deposited on the BPSG layer 30 and in the via hole 40 by low-pressure chemical vapor deposition processes. The thickness of the polysilicon layer 50 is about 500 to 1000 Å, and the thickness of the tungsten silicide layer 60 is about 1000 to 1500 Å.

Referring to FIG. 1C, the tungsten silicide layer 60 and the polysilicon layer 50 are etched to form a bit line 70 and a polysilicon via of a DRAM. Because the polysilicon via is hollow, the width of patterned bit line 70 is wider than the width of the via hole 40 to ensure the conductivity of the bit line 70. The border layout of the bit line increases the difficulty of the bit-line layout.

Because the polysilicon layer 20 is only covered by the polysilicon layer 50 and the tungsten silicide layer 60, once a situation of misalignment happens in a follow-up photolithography process, the polysilicon via or the bit line 70 is etched through, which further causes damage to the polysilicon layer 20 underneath. The damage to the polysilicon layer 20 leads to the occurrence of leakage current that degrades the performance and efficiency of a COB DRAM cell.

The width of the bit line 70 on the via hole 40 is made to be wider than the width of the via hole 40 to reduce the damage caused by misalignment. However, the widened bit line on the via hole 40 further increases the difficulty of the layout of a DRAM bit line.

SUMMARY OF THE INVENTION

It is therefore an objective of the present invention to provide a structure of a polysilicon via to prevent the occurrence of leakage currents, and further simplify the circuit layout.

In accordance with the foregoing and other objectives of the present invention, the invention provides a structure of a polysilicon via that prevents the occurrence of leakage currents in the presence of misalignment in the follow-up photolithography process.

The formation of the structure of a polysilicon via according to the invention mainly includes providing a substrate containing a conducting layer and a dielectric layer thereon, patterning the dielectric layer to form a via hole, filling the via hole with polysilicon to form a via plug, and forming a polysilicon layer and a silicide layer on top of the via plug as a bit line. The via plug is electrically connected to a conducting layer underneath the dielectric layer. The width of the bit line is equal to the width of the via hole. The structure according to the invention can prevent the occurrence of leakage current, and simplify the layout of bit lines as well.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new structure of a polysilicon via to prevent the occurrence of leakage currents and to simplify the layout of bit lines, as shown in FIGS. 2A through 2F.

Figure 1A:
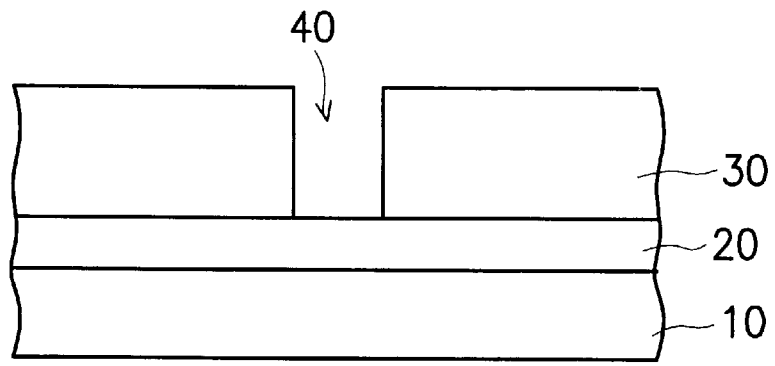
FIGS. 1A through 1C are cross-sectional views showing a method for forming a conventional polysilicon via.
Figure 1B:
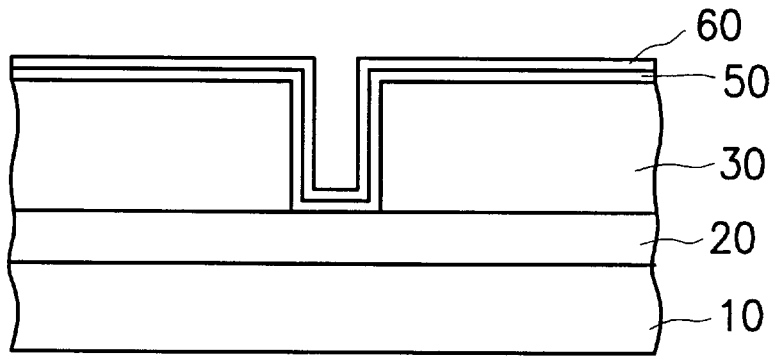
Figure 1C:
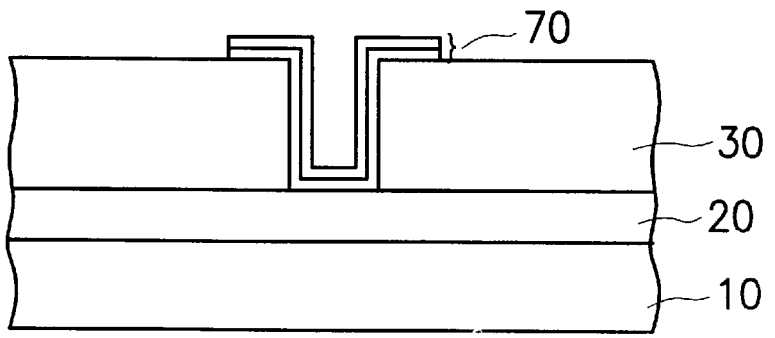
Figure 2A:
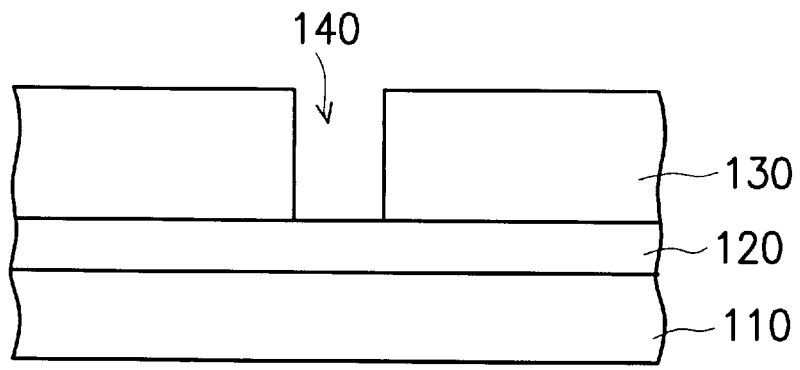
FIGS. 2A through 2F are cross-sectional views showing the forming of a polysilicon via according to a preferred embodiment of the invention.

Referring to FIG. 2A, a conducting layer 120 is deposited on a provided substrate 110, wherein the material of the conducting layer 120 is preferably polysilicon, or other material having similar properties. Normally, a polysilicon gate is formed on the substrate 110 before the formation of the conducting layer 120, wherein the polysilicon gate is connected to a word line. A dielectric layer 130 is deposited on the conducting layer 120, wherein the dielectric layer includes silicon oxide or borophosphosilicate glass (BPSG). The dielectric layer 130 is patterned to form a via hole 140 exposing the conducting layer 120 by performing an etching process, such as a dry etching process.

Figure 2B:
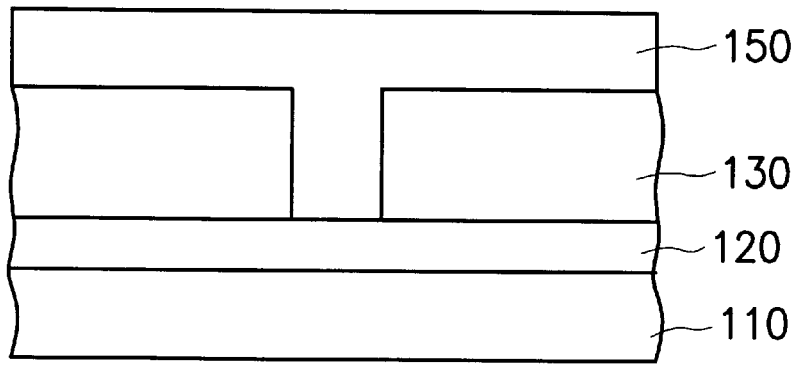
Figure 2C:
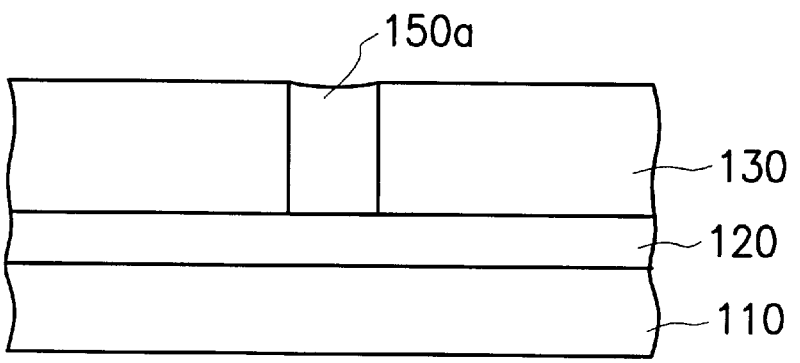

Referring next to FIG. 2B, a polysilicon layer 150 is formed on the dielectric layer 130 and filled in the via hole 140 by performing, for example, a low press chemical vapor deposition (LPCDV) process. By performing an etching back process on the polysilicon layer 150 and using the dielectric layer 130 as an etching end point, the polysilicon on top of the dielectric layer 130 is removed to form a polysilicon plug 150*a* in the via hole 140, as shown in FIG. 2C. As is further illustrated in FIG. 2C, except for a slight arcuate "dip" in the upper surface of the polysilicon plug 150*a*, the polysilicon plug 150*a* has substantially the same thickness as the dielectric layer 130. As will be appreciated by those skilled in the art, the dip in the upper surface of the polysilicon plug 150*a* results from the chemical mechanical polishing (CMP) process.

Figure 2D:
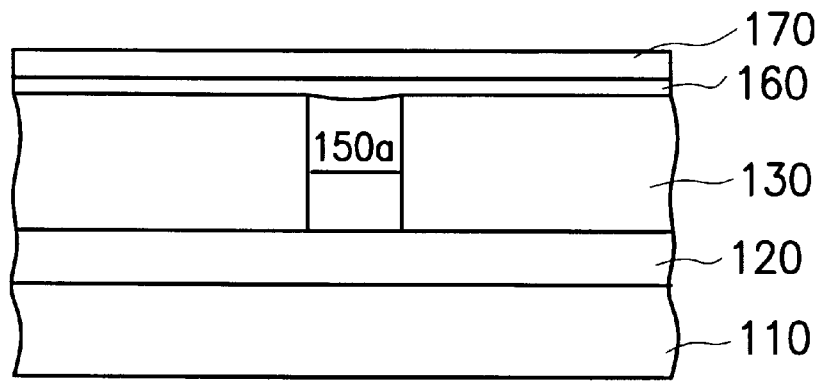

Referring to FIG. 2D, another polysilicon layer 160 is formed on the dielectric layer 130 and the polysilicon plug 150*a* by performing, for example, a LPCVD process, wherein the thickness of the polysilicon layer 160 is about 500 Å to 1000 Å. A silicide layer 170, such as one of tungsten silicide, is formed on the polysilicon layer 160 by performing a LPCVD process or other process that is able to achieve the same goal, wherein the thickness of the silicide layer 170 is about 1000 Å to 1500 Å.

Figure 2E:
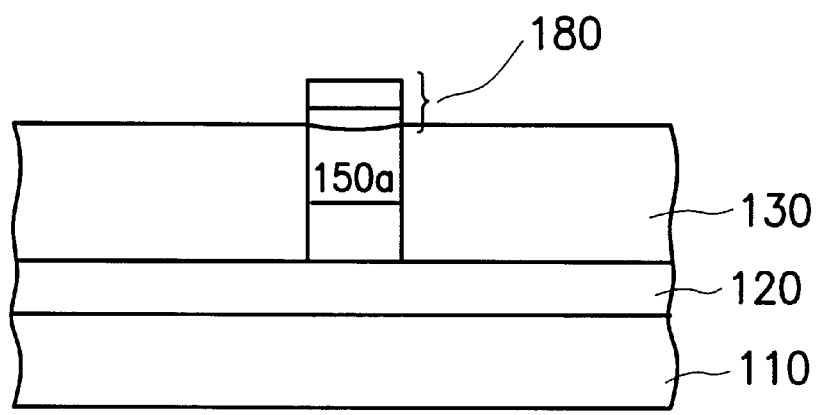
Figure 2F:
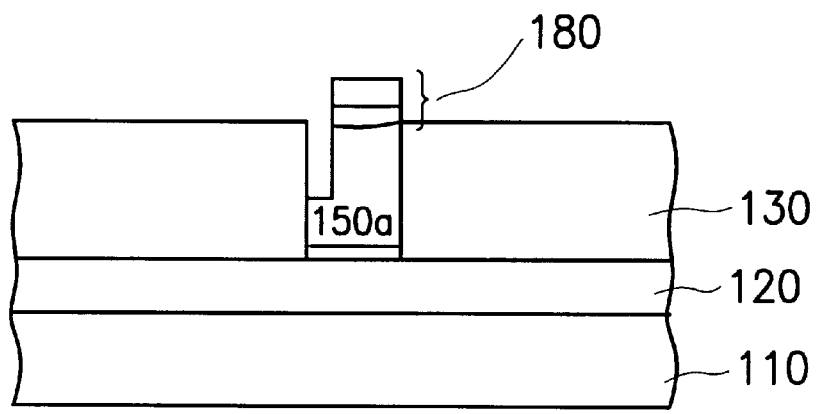

Referring next to FIGS. 2E and 2F, the silicide layer 170 and the polysilicon layer 160 are patterned to form a bit line 180 by performing a photolithography process and an etching process, wherein the etching process includes a dry etching process. Because the width of the bit line 180 is equal to the width of the via hole 140, which is narrower than a conventional bit line, the bit line layout is simplified, and the integration of devices can be increased as well. In the case that misalignment happens in the photolithography process, the conducting layer 120 is still free from being damaged by the follow-up etching process, owing to the protection of the polysilicon plug 150*a*. The height of the polysilicon plug 150*a* is normally around 5000 Å, so, even with the occurrence of misalignment, the etching process cannot etch through the entire polysilicon plug 150*a*, as shown in FIG. 2F. Therefore, the occurrence of leakage current is avoided.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A structure of a polysilicon via, the method comprising:
   a semiconductor substrate, wherein the semiconductor substrate further comprises a conducting layer thereon;
   a single-layered dielectric layer on the conducting layer;
   a polysilicon plug with a first width formed in the single-layered dielectric layer so that the polysilicon plug and the single-layered dielectric layer subsequently have the same thickness, wherein the polysilicon plug is electrically connected to the conducting layer;
   a polysilicon layer with a second width on the polysilicon plug, wherein the second width is the same as the first width and the polysilicon layer is electrically connected to the polysilicon plug; and
   a silicide layer formed with a third width on the polysilicon layer, wherein the third width is the same as the first width and the thickness of the silicide layer is larger than the thickness of the polysilicon layer.

2. The structure of claim 1, wherein the semiconductor substrate further comprises a gate.

3. The structure of claim 1, wherein the single-layered dielectric layer is composed of silicon oxide.

4. The structure of claim 1, wherein the single-layered dielectric layer is composed of borophosphosilicate glass.

5. The structure of claim 1, wherein the polysilicon layer is about 500 to 1000 Å thick.

6. The structure of claim 1, wherein the silicide layer is about 1000 to 1500 Å thick.

7. The structure of claim 1, wherein the silicide layer includes tungsten silicide.

8. The structure of claim 1, wherein the polysilicon plug is about 5000 Å high.

9. A structure of a polysilicon via, the method comprising:
   a semiconductor substrate, wherein the semiconductor substrate further comprises a conducting layer thereon;
   a single-layered dielectric layer on the conducting layer;
   a polysilicon plug formed in the single-layered dielectric layer so that the polysilicon plug and the single-layered dielectric layer subsequently have the same thickness, wherein the polysilicon plug is electrically connected to the conducting layer;
   a polysilicon layer on the polysilicon plug, wherein the polysilicon layer has a sufficiently small width to just be located only on the polysilicon plug; and
   a silicide layer formed on the polysilicon layer, wherein the thickness of the silicide layer is larger than the thickness of the polysilicon layer.

* * * * *